US009787914B2

(12) United States Patent
Sengupta et al.

(10) Patent No.: US 9,787,914 B2
(45) Date of Patent: Oct. 10, 2017

(54) STACKED MODULAR ARCHITECTURE HIGH-RESOLUTION THERMAL CHIP CAMERA

(71) Applicant: BAE Systems Information and Electronic Systems Integration Inc., Nashua, NH (US)

(72) Inventors: Louise C Sengupta, Ellicott City, MD (US); Pierre-Alain S Auroux, Rockville, MD (US); Evan A Binkerd, Merrimack, NH (US); Richard J Blackwell, Jr., Dracut, MA (US); Mihir D Boal, Nashua, NH (US); Jeffrey F Bryant, Amherst, NH (US); Don A Harris, Columbia, MD (US); Donald D McManus, Bedford, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 284 days.

(21) Appl. No.: 14/845,861

(22) Filed: Sep. 4, 2015

(65) Prior Publication Data

US 2017/0070685 A1     Mar. 9, 2017

(51) Int. Cl.
| | | |
|---|---|---|
| *H04N 5/33* | (2006.01) | |
| *H01L 27/146* | (2006.01) | |
| *H01L 27/108* | (2006.01) | |
| *H01L 27/11517* | (2017.01) | |
| *H01L 27/11563* | (2017.01) | |
| *H04N 5/225* | (2006.01) | |

(52) U.S. Cl.
CPC ......... *H04N 5/33* (2013.01); *H01L 27/10805* (2013.01); *H01L 27/11517* (2013.01); *H01L 27/11563* (2013.01); *H01L 27/1469* (2013.01); *H01L 27/14618* (2013.01); *H01L 27/14625* (2013.01); *H01L 27/14632* (2013.01); *H01L 27/14634* (2013.01); *H01L 27/14636* (2013.01); *H01L 27/14685* (2013.01); *H01L 27/14687* (2013.01); *H04N 5/2257* (2013.01)

(58) Field of Classification Search
CPC .. H04N 5/33; H04N 5/2257; H01L 27/10805; H01L 27/14618; H01L 27/14634; H01L 27/1469; H01L 27/14685; H01L 27/14625; H01L 27/14632; H01L 27/11517; H01L 27/14636; H01L 27/11563; H01L 27/14687
USPC ....................................................... 250/330
See application file for complete search history.

(56) References Cited

U.S. PATENT DOCUMENTS

| | | | | |
|---|---|---|---|---|
| 2013/0235210 | A1* | 9/2013 | Tinkler | ............ G01J 5/20 348/164 |
| 2013/0321639 | A1* | 12/2013 | Kuiken | ............ H04N 5/33 348/164 |

* cited by examiner

*Primary Examiner* — David Porta
*Assistant Examiner* — Gisselle Gutierrez
(74) *Attorney, Agent, or Firm* — Maine Cernota & Rardin

(57) ABSTRACT

An uncooled high-resolution 12 micron pixel pitch 3D-stacked component thermal camera including an electronics board, a camera circuit card assembly (CCA) with an application-specific integrated circuit (ASIC), a synchronous dynamic random access memory (SDRAM), flash memory, a spacer, a wafer level packaged Focal Plane Array (FPA) wafer with a lens housing attach ring on the FPA, and a window.

19 Claims, 7 Drawing Sheets

PERSPECTIVE VIEW OF VGA FPA

PERSPECTIVE VIEW OF VGA FPA

- Flash 205
- Spacer 210
- 215 SDRAM
- 220 ASIC
- 225 Focal Plane
- 230 Window
- 235 Lens Housing 240 Perspective

PERSPECTIVE AND EXPLODED VIEWS OF A SMART CHIP CAMERA

FIG. 2

CCA BOARD
FIG. 3

400

405

410

415

FRONT AND REAR VIEWS OF CCA BOARD AND PERSPECTIVE VIEW OF LENS MOUNT

FIG. 4

VIEWS OF THE INTEGRATION OF THE CHIP CAMERA WITH A CELL PHONE
FIG. 5

FRONT AND REAR VIEWS OF INTEGRATION OF CHIP CAMERA WITH A FLEX CABLE

FIG. 6

CHIP CAMERA METHOD

FIG. 7

STACKED MODULAR ARCHITECTURE HIGH-RESOLUTION THERMAL CHIP CAMERA

STATEMENT OF GOVERNMENT INTEREST

The invention was made with United States Government support under Contract No. HR0011-11-C-0126 awarded by the Defense Advanced Research Projects Agency (DARPA). The United States Government has certain rights in this invention.

FIELD OF THE INVENTION

The invention relates to uncooled thermal imagers and more particularly relates to high-resolution thermal chip cameras.

BACKGROUND OF THE INVENTION

Traditional uncooled thermal imager cost is prohibitive for mass-production. In addition, the size, weight, power requirements (and cost) of these imagers may not be well-suited for Unmanned Arial Vehicles (UAV) and man-portable applications.

A need exists for uncooled cameras which are small, light-weight, power efficient, and inexpensive enough to be well-suited for UAV and man portable applications.

SUMMARY OF THE INVENTION

An embodiment provides an uncooled high-resolution 12 micron pixel pitch 3D-stacked component thermal camera device comprising a camera circuit card assembly (CCA) comprising an application-specific integrated circuit (ASIC); a synchronous dynamic random access memory (SDRAM); a flash memory wafer; and a wafer level packaged Focal Plane Array (FPA) wafer. In embodiments, the CCA comprises a small circuit board with the FPA on one side, the ASIC, the SDRAM memory and the flash memory and other supporting circuits and output connector on the back side of the CCA. In other embodiments, the configuration of the camera comprises the FPA and electronics adjacent to each other on a same side of a circuit board of the CCA. In subsequent embodiments, the wafer level packaged FPA comprises a focal plane and a window, a lens integrated with the camera by a lens housing attach ring on the FPA, and a spacer between the SDRAM memory and flash memory. For additional embodiments, the CCA comprises Surface Mount Technology (SMT) devices. In another embodiment, the camera operates at 15 Hz, 30 Hz, and 60 Hz with a slow frame rate of about 7.5 Hz to about 8.33 Hz. For a following embodiment, the ASIC, the SDRAM, and the flash memory wafers comprise full thickness substrates. In subsequent embodiments, the ASIC, the SDRAM, and the flash memory wafers are thinned. In additional embodiments, at least one of the ASIC, the SDRAM, and the flash memory has a full thickness substrate and at least one is thinned.

Another embodiment provides a method for preparing a bare die for a 12 micron pixel pitch uncooled high-resolution thermal camera using 3D-stacking implementation comprising dicing an application-specific integrated circuit (ASIC) wafer; dicing synchronous dynamic random access memory (SDRAM) wafer; dicing flash wafer; dicing a wafer level packaged Focal Plane Array (FPA) wafer; assembling a circuit card assembly (CCA); die attaching the ASIC; die attaching the SDRAM; die attaching a spacer; die attaching the flash; wire bonding the SDRAM to the ASIC; wire bonding the flash to the ASIC; wire bonding the ASIC to the CCA; wire bonding the SDRAM to the CCA; wire bonding the flash to the CCA; die attaching the FPA; wire bonding the FPA to the CCA; and filling backside whereby the ASIC stack wire bonds are protected. In included embodiments, the CCA assembly comprises attaching standard Surface Mount Technology (SMT) devices. In yet further embodiments, the camera operates at 15 Hz, 30 Hz, and 60 Hz. In related embodiments, the diced ASIC wafer, the diced SDRAM wafer, and the diced flash wafer are full thickness substrates. For further embodiments, the diced ASIC wafer, the diced SDRAM wafer, and the diced flash wafer are thinned. In ensuing embodiments, at least one of the diced ASIC wafer, the diced SDRAM wafer, and the diced flash wafer has a full thickness substrate and at least one is thinned. For yet further embodiments, the CCA comprises a small circuit board with the FPA on one side, the ASIC, the SDRAM memory and the flash memory and other supporting circuits and output connector on a back side of the CCA. For more embodiments, a configuration of the camera comprises the FPA and electronics adjacent to each other on a same side of a circuit board of the CCA. In continued embodiments, the wafer level packaged FPA comprises a focal plane and a window, a lens integrated with the camera by a lens housing attach ring on the FPA, and a spacer between the SDRAM memory and flash memory. For additional embodiments, the camera operates with a slow frame rate of about 7.5 Hz to about 8.33 Hz.

A yet further embodiment provides an uncooled 12 micron pixel pitch high-resolution thermal camera system using 3D-stacking comprising a camera circuit card assembly (CCA); an application-specific integrated circuit (ASIC), the ASIC comprising an imaging engine to operate a Focal Plane Array (FPA) and provide pixel corrections and calibration; a synchronous dynamic random access memory (SDRAM); a flash memory wafer, wherein the SDRAM memory and the flash memory are stacked on the ASIC; and a wafer level packaged FPA wafer comprising the FPA, wherein the FPA comprises alignment pixels and buffer pixels and a partition architecture; a lens comprising an f-number of about 1.2, a Field Of View (FOV) of about 42°×26°, and an Instantaneous Field Of View (IFOV) of about 400 μrad; a Cameralink input output adapter; a Mobile Industry Processor Interface (MIPI) format adapter; and dual row biasing for large arrays whereby adequate pulse time and sensitivity are maintained.

DETAILED DESCRIPTION

The features and advantages described herein are not all-inclusive and, in particular, many additional features and advantages will be apparent to one of ordinary skill in the art in view of the drawings, specification, and claims. Moreover, it should be noted that the language used in the specification has been selected principally for readability and instructional purposes, and not to limit in any way the scope of the inventive subject matter. The invention is susceptible of many embodiments. What follows is illustrative, but not exhaustive, of the scope of the invention.

In one embodiment of the invention, the SMART chip camera costs less than $500, presents a volume smaller than 3.5 cubic centimeters, weighs less than 25 grams, and consumes less than 500 milliwatts. Wafer-level technologies are leveraged at multiple levels to accomplish superior achievements such as packaging of the bolometers and calibration of the units. In addition, the electronics board is rendered more compact and less power consumptive by using 3D-stacking implementation. Finally, the IR camera is compatible with Android-based cell phones.

Figure 1:
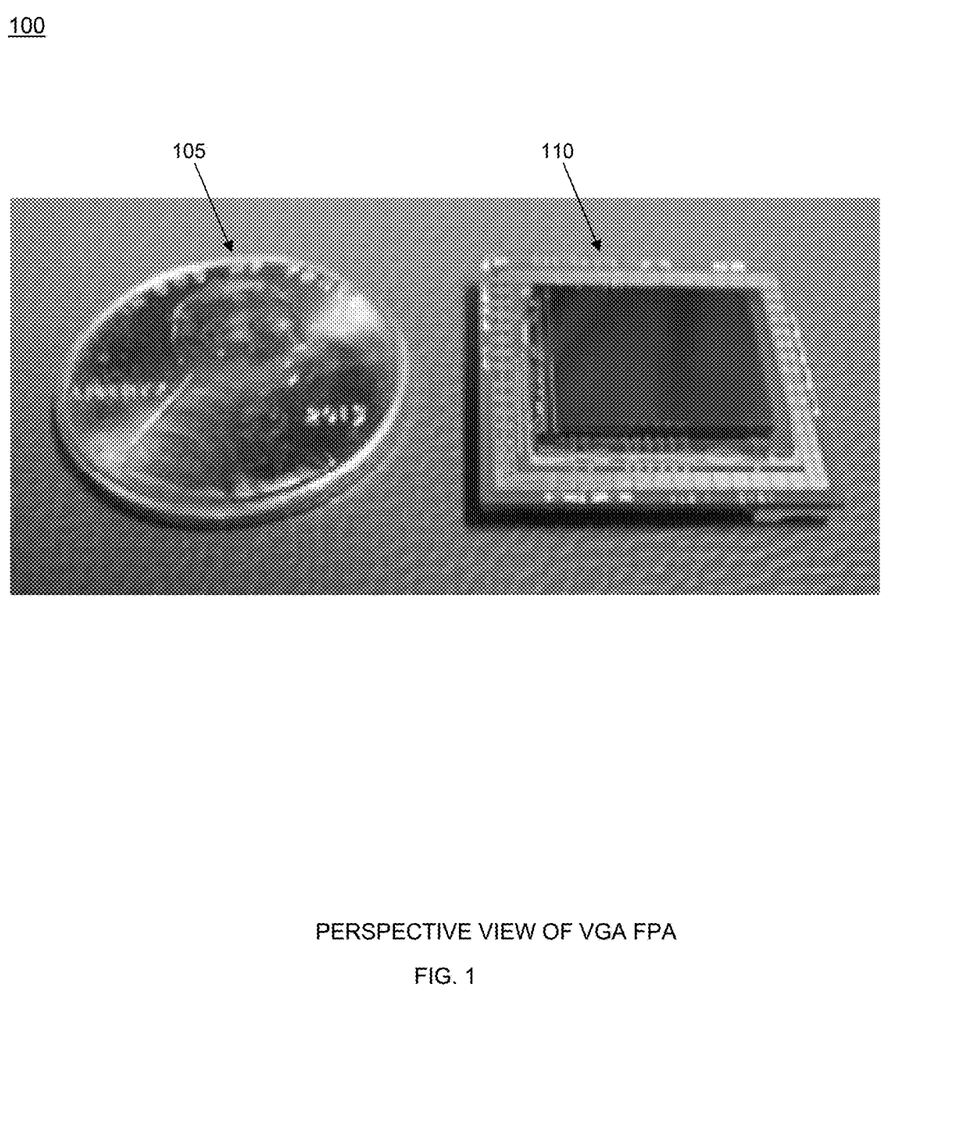
FIG. 1 is a perspective view of a VGA FPA configured in accordance with an embodiment of the invention.

FIG. 1 shows a perspective view 100 of the Low Cost Thermal Imager-Manufacturing (LCTI-M) sensor (without lens). For comparison, penny 105 is shown beside sensor 110. The top side is the wafer level packaged VGA FPA. The back side contains an ASIC imaging engine, memory, supporting electronics, and system flex connector. This module, with a very compact wafer-scale compatible f/1.2 lens, has been demonstrated and integrated into a commercial cell phone displaying the IR image on the cell phone display using a custom Android application. The basic VGA FPA was available early in the LCTI-M program and has seen early insertions into several applications requiring uncooled cameras which are small, light-weight, power efficient, and inexpensive.

Figure 2:
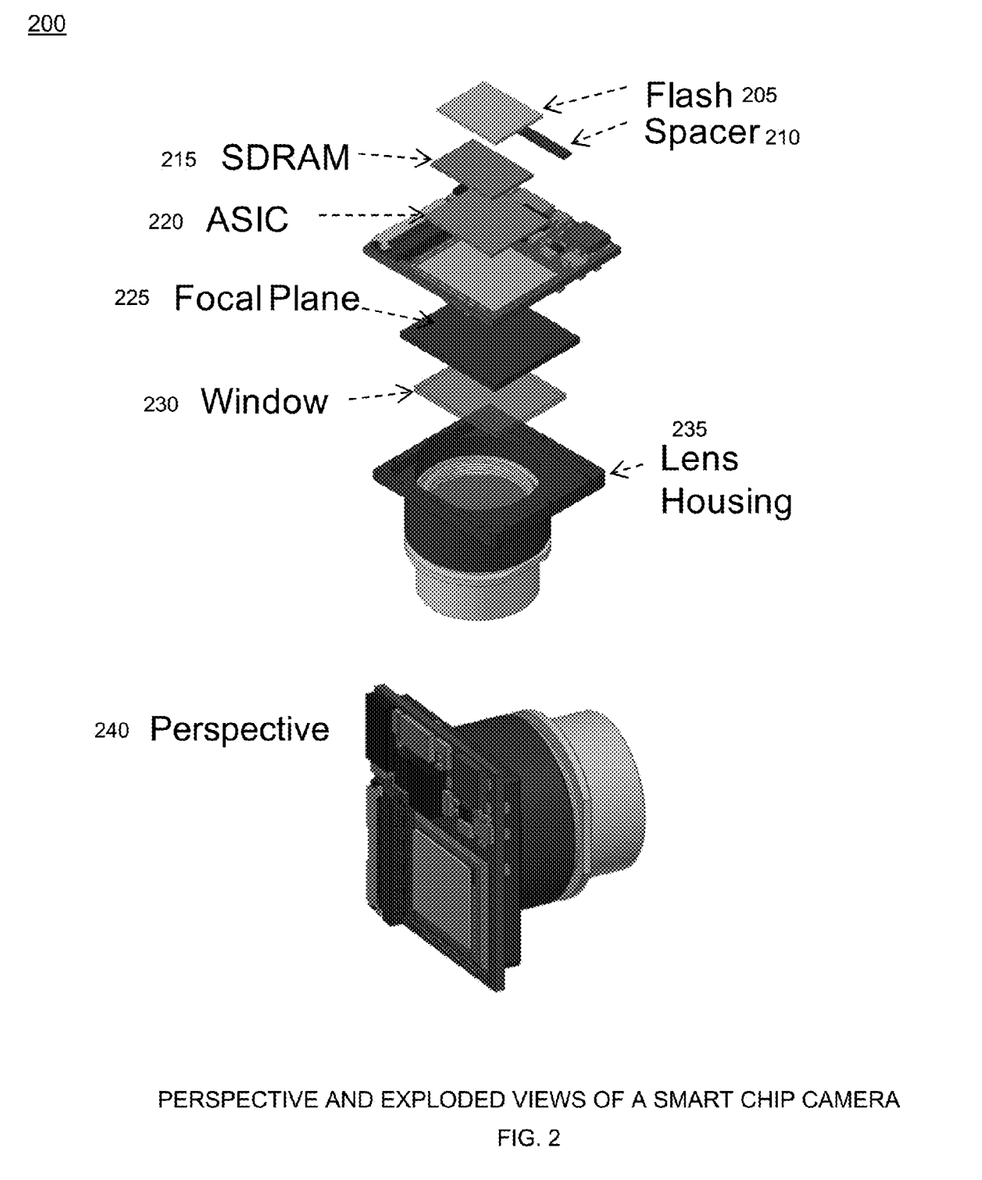
FIG. 2 shows perspective and exploded views of a Stacked Modular Architecture High-Resolution Thermal (SMART) chip camera configured in accordance with an embodiment of the invention.

FIG. 2 shows perspective and exploded views of a SMART chip camera 200. Depicted are flash 205, spacer 210, SDRAM 215, ASIC 220, focal plane 225, window 230, lens housing 235, and perspective view 240. In a camera embodiment, significant components include 1) wafer level packaged FPA (focal plane and window), 2) ASIC for imaging engine to operate FPA and provide pixel corrections/calibration, 3) memory (SDRAM and flash) stacked on ASIC (or in close proximity), 4) small circuit board with FPA on one side and ASIC/memory and other supporting circuits and output connector on back side, 5) lens integrated with 1-4, 6) an alternate configuration with FPA and electronics adjacent to each other on the same side of the circuit board.

Figure 3:
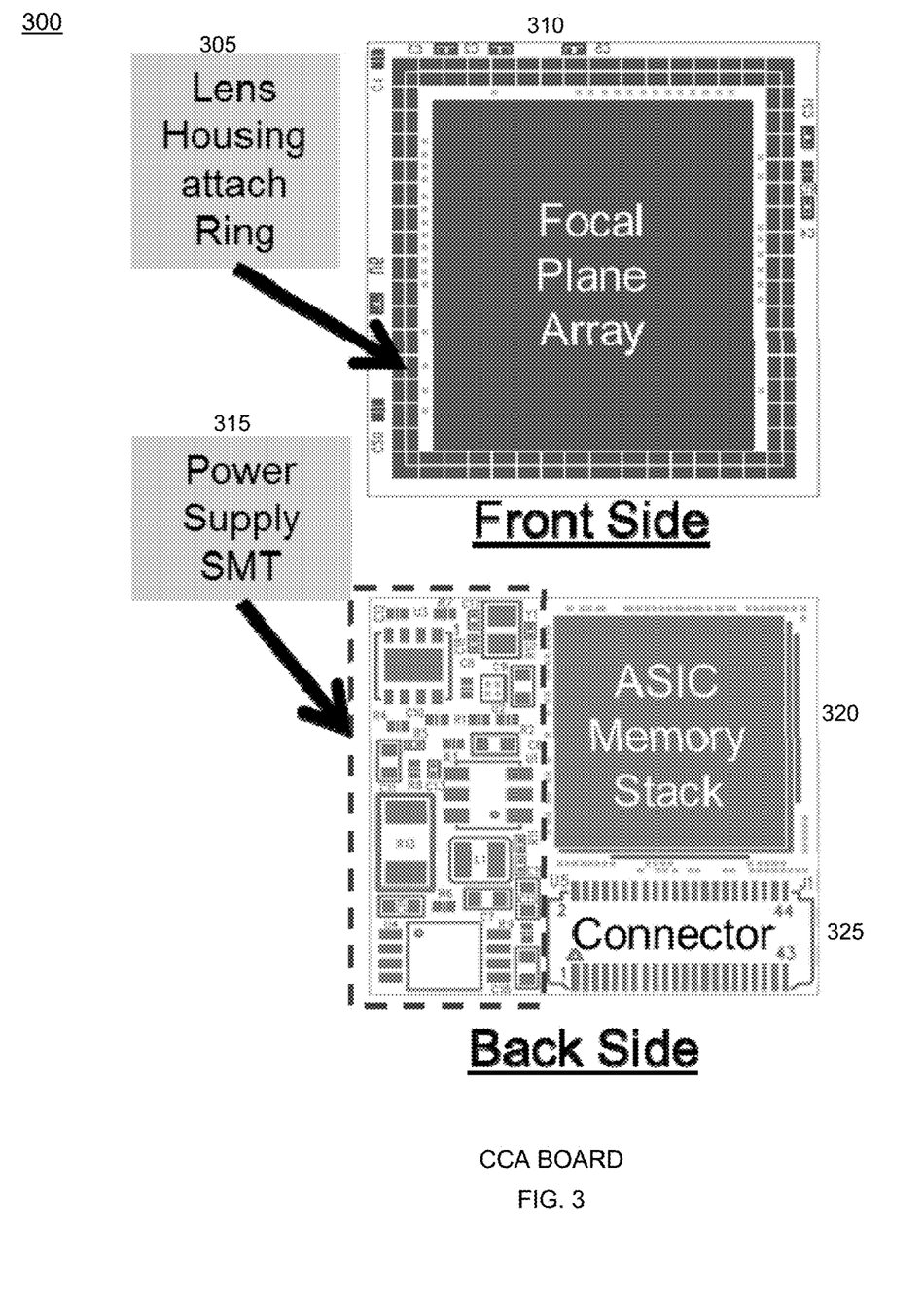
FIG. 3 shows front and rear elevational views of the circuit card assembly (CCA) board configured in accordance with an embodiment of the invention.

FIG. 3 shows front and rear elevation views 300 of the circuit card assembly (CCA) board. Depicted components include lens housing attach ring 305, focal plane array 310 on front side, and power supply SMT 315, ASIC memory stack 320, and connector 325 on back side.

Figure 4:
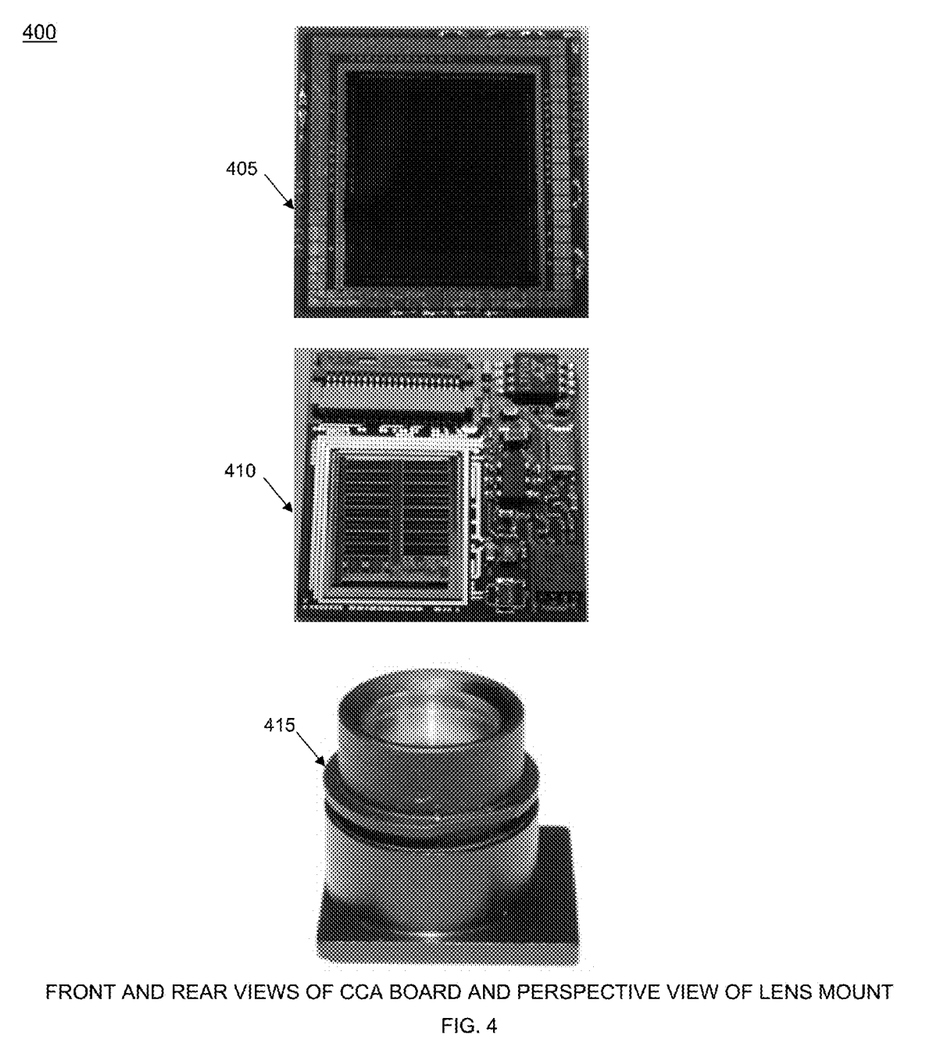
FIG. 4 shows front and rear views of the CCA board and a perspective view of the lens mount configured in accordance with an embodiment of the invention.

FIG. 4 shows the assembly of a prototype 400. Depicted are front side of the wafer level packaged FPA circuit board 405; back side of the circuit board with stacked ASIC/memory, connector, and supporting circuits 410; and compact lens for mounting on the front side of the CCA 415. Embodiments have other lens mount methods.

Figure 5:
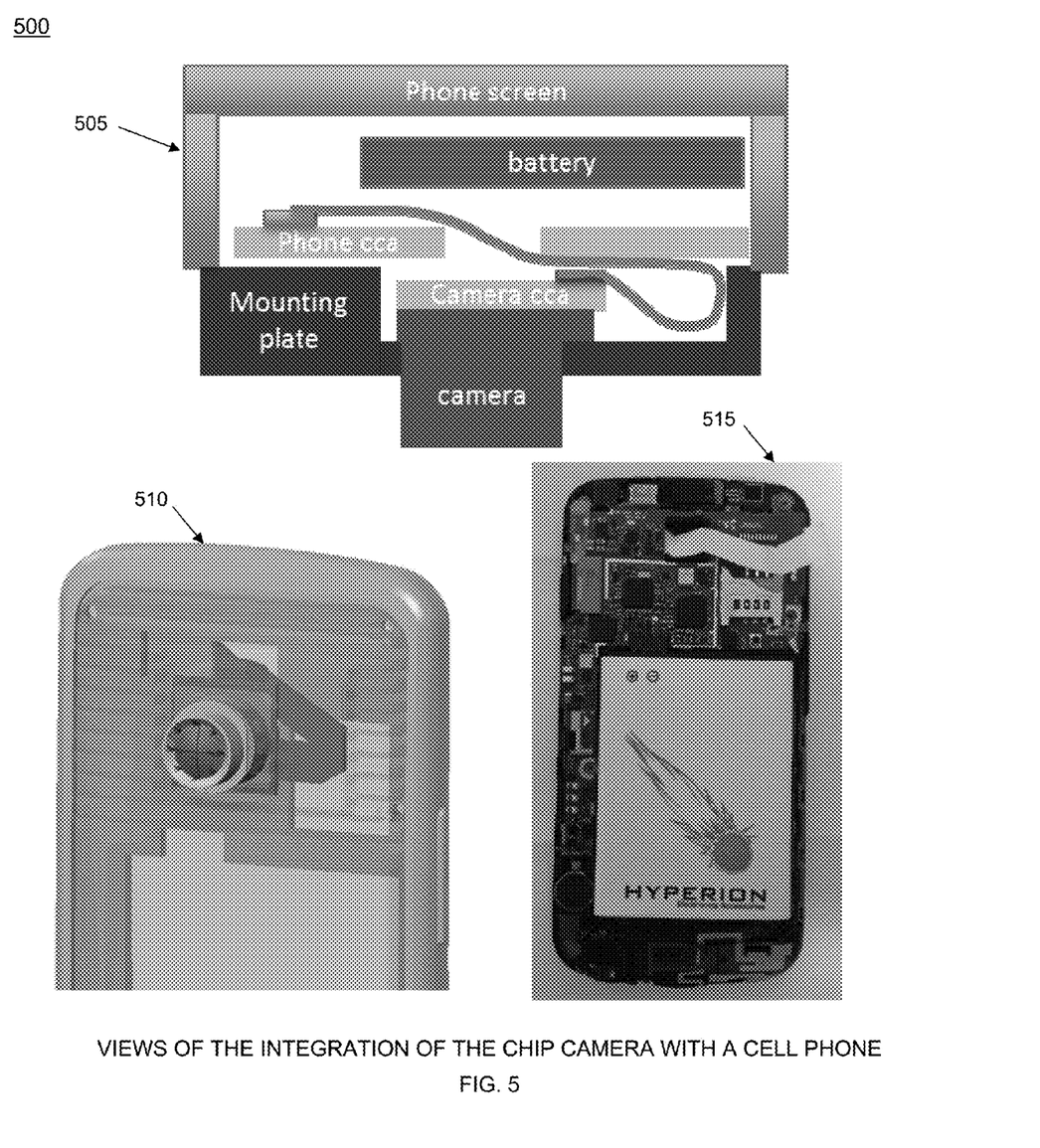
FIG. 5 shows views of the integration of the chip camera with a cell phone configured in accordance with an embodiment of the invention.

FIG. 5 shows the physical integration of the SMART chip camera with a cell phone 500. Depicted are component arrangement 505; lens-side perspective view 510; and cell phone device internals 515.

Figure 6:
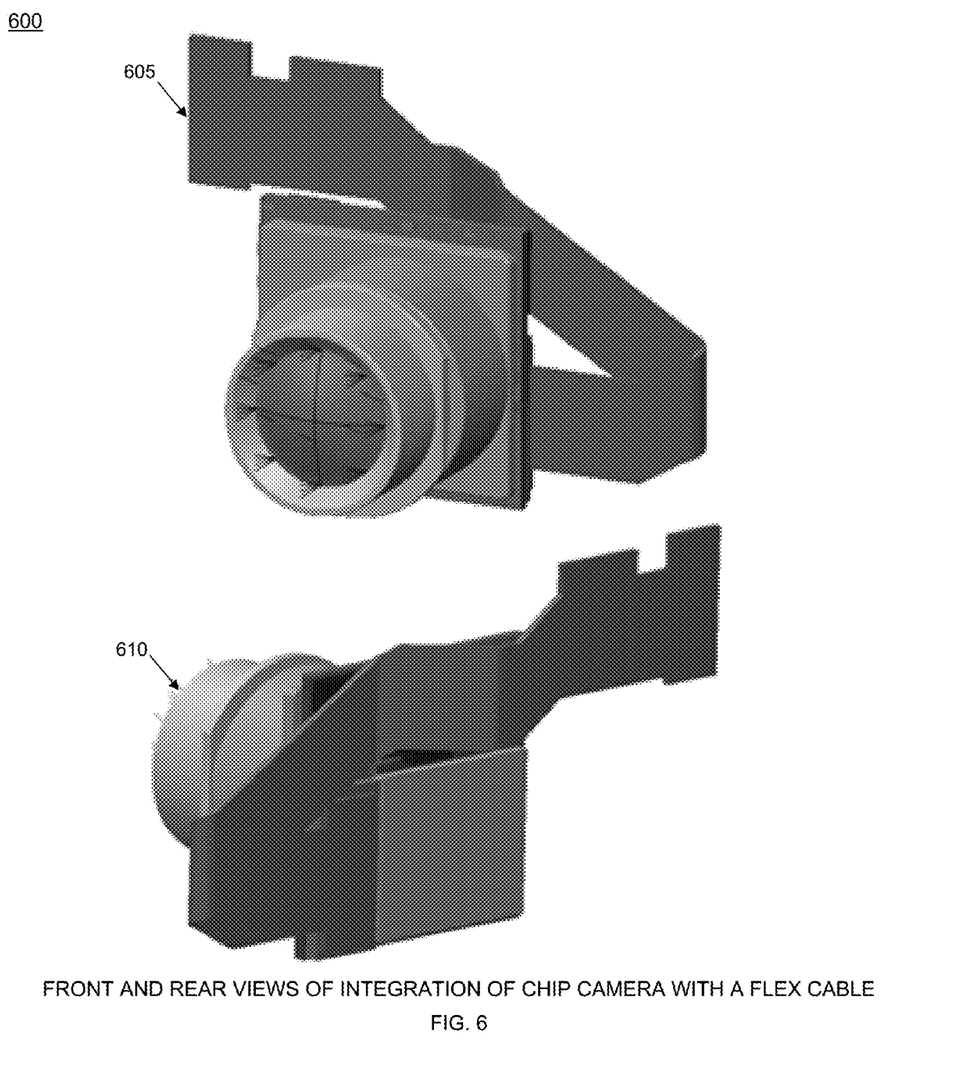
FIG. 6 shows front and rear views of the integration of the chip camera with a flex cable configured in accordance with an embodiment of the invention.

FIG. 6 shows views 600 of the integration of the SMART chip camera with a flex cable showing a service loop. Depicted are view from the lens front side 605 and view from the lens rear side 610. The flex cable has a chip to convert sensor output to Mobile Industry Processor Interface (MIPI) format (to interface with phone processors or other MIPI devices).

Figure 7:
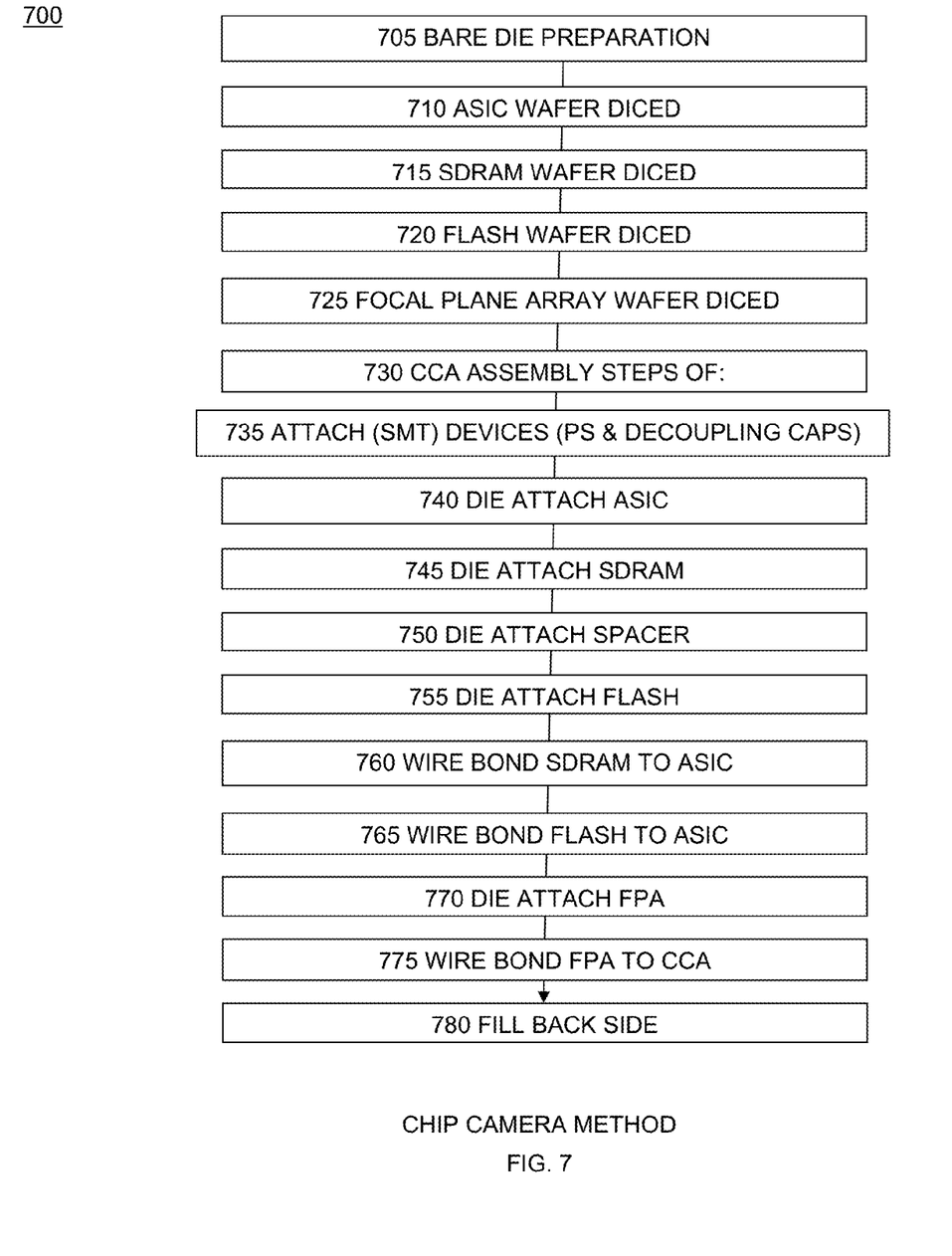
FIG. 7 depicts a CHIP camera method configured in accordance with an embodiment of the invention.

FIG. 7 presents device manufacturing steps 700. CCA manufacturing steps comprise bare die preparation 705; ASIC wafer diced 710; SDRAM wafer diced 715; flash wafer diced 720 (these may be thinned or full thickness substrates); wafer level packaged Focal Plane Array wafer diced 725; CCA Assembly 730 comprising: attach standard Surface Mount Technology (SMT) devices 735 (i.e. power supply and decoupling capacitors); die attach ASIC 740; die attach SDRAM 745; die attach spacer 750; and die attach flash 755; wire bond SDRAM to ASIC 760; wire bond flash to ASIC 765; die attach FPA 770; wire bond FPA to CCA 775; and fill back side to protect ASIC stack wirebonds 780.

The foregoing description of the embodiments of the invention has been presented for the purposes of illustration and description. It is not intended to be exhaustive or to limit the invention to the precise form disclosed. Each and every page of this submission, and all contents thereon, however characterized, identified, or numbered, is considered a substantive part of this application for all purposes, irrespective of form or placement within the application. This specification is not intended to be exhaustive or to limit the invention to the precise form disclosed. Many modifications and variations are possible in light of this disclosure. Other and various embodiments will be readily apparent to those skilled in the art, from this description, figures, and the claims that follow. It is intended that the scope of the invention be limited not by this detailed description, but rather by the claims appended hereto.

What is claimed is:

1. An uncooled high-resolution 12 micron pixel pitch 3D-stacked component thermal camera device comprising:
   a camera circuit card assembly (CCA) comprising:
   an application-specific integrated circuit (ASIC);
   a synchronous dynamic random access memory (SDRAM);
   a flash memory wafer;
   and a wafer level packaged Focal Plane Array (FPA) wafer
   wherein said CCA comprises a small circuit board with said FPA on one side,
   said ASIC, said SDRAM memory and said flash memory and other supporting circuits and output connector on a back side of said CCA.

2. The system of claim 1, wherein configuration of said camera comprises said FPA and electronics adjacent to each other on a same side of a circuit board of said CCA.

3. The system of claim 1, wherein said wafer level packaged FPA comprises a focal plane and a window, a lens integrated with said camera by a lens housing attach ring on said FPA, and a spacer between said SDRAM memory and flash memory.

4. The system of claim 1, wherein said CCA comprises Surface Mount Technology (SMT) devices.

5. The system of claim 1, wherein said camera operates at 15 Hz, 30 Hz, and 60 Hz with a slow frame rate of about 7.5 Hz to about 8.33 Hz.

6. The system of claim 1, wherein said ASIC, said SDRAM, and said flash memory wafers comprise full thickness substrates.

7. The system of claim 1, wherein said ASIC, said SDRAM, and said flash memory wafers are thinned.

8. The system of claim 1, wherein at least one of said ASIC, said SDRAM, and said flash memory has a full thickness substrate and at least one is thinned.

9. A method for preparing a bare die for a 12 micron pixel pitch uncooled high-resolution thermal camera using 3D-stacking implementation comprising:
 dicing an application-specific integrated circuit (ASIC) wafer;
 dicing synchronous dynamic random access memory (SDRAM) wafer;
 dicing flash wafer;
 dicing a wafer level packaged Focal Plane Array (FPA) wafer;
 assembling a circuit card assembly (CCA);
 die attaching said ASIC;
 die attaching said SDRAM;
 die attaching a spacer;
 die attaching said flash;
 wire bonding said SDRAM to said ASIC;
 wire bonding said flash to said ASIC;
 wire bonding said ASIC to said CCA;
 wire bonding said SDRAM to said CCA;
 wire bonding said flash to said CCA;
 die attaching said FPA;
 wire bonding said FPA to said CCA; and
 filling backside whereby said ASIC stack wire bonds are protected.

10. The method of claim 9, wherein said CCA assembly comprises:
 attaching standard Surface Mount Technology (SMT) devices.

11. The method of claim 9, wherein said camera operates at 15 Hz, 30 Hz, and 60 Hz.

12. The method of claim 9, wherein said diced ASIC wafer, said diced SDRAM wafer, and said diced flash wafer are full thickness substrates.

13. The method of claim 9, wherein said diced ASIC wafer, said diced SDRAM wafer, and said diced flash wafer are thinned.

14. The method of claim 9, wherein at least one of said diced ASIC wafer, said diced SDRAM wafer, and said diced flash wafer has a full thickness substrate and at least one is thinned.

15. The method of claim 9, wherein said CCA comprises a small circuit board with said FPA on one side, said ASIC, said SDRAM memory and said flash memory and other supporting circuits and output connector on a back side of said CCA.

16. The method of claim 9, wherein a configuration of said camera comprises said FPA and electronics adjacent to each other on a same side of a circuit board of said CCA.

17. The method of claim 9, wherein said wafer level packaged FPA comprises a focal plane and a window, a lens integrated with said camera by a lens housing attach ring on said FPA, and a spacer between said SDRAM memory and flash memory.

18. The method of claim 9, wherein said camera operates with a slow frame rate of about 7.5 Hz to about 8.33 Hz.

19. An uncooled 12 micron pixel pitch high-resolution thermal camera system using 3D-stacking comprising:
 a camera circuit card assembly (CCA);
 an application-specific integrated circuit (ASIC), said ASIC comprising an imaging engine to operate a Focal Plane Array (FPA) and provide pixel corrections and calibration;
 a synchronous dynamic random access memory (SDRAM);
 a flash memory wafer, wherein said SDRAM memory and said flash memory are stacked on said ASIC; and
 a wafer level packaged FPA wafer comprising said FPA, wherein said FPA comprises alignment pixels and buffer pixels and a partition architecture;
 a lens comprising an f-number of about 1.2, a Field Of View (FOV) of about 42°×26°, and an Instantaneous Field Of View (IFOV) of about 400 μrad;
 a Cameralink input output adapter;
 a Mobile Industry Processor Interface (MIPI) format adapter; and
 dual row biasing for large arrays whereby adequate pulse time and sensitivity are maintained.

* * * * *